United States Patent [19]
Niccoli

[11] Patent Number: 6,054,393
[45] Date of Patent: Apr. 25, 2000

[54] METHOD FOR IMPROVING THE WET PROCESS CHEMICAL SEQUENCE

[75] Inventor: John V. Niccoli, Plano, Tex.

[73] Assignee: Texas Instruments Incorporated, Dallas, Tex.

[21] Appl. No.: 09/004,239

[22] Filed: Jan. 8, 1998

Related U.S. Application Data

[60] Provisional application No. 60/034,214, Jan. 9, 1997.

[51] Int. Cl.[7] .................................................. H01L 21/00
[52] U.S. Cl. ............................ 438/745; 756/906; 134/3
[58] Field of Search .................................. 438/689, 906, 438/745, 756; 134/3

[56] References Cited

U.S. PATENT DOCUMENTS

| | | | |
|---|---|---|---|
| 4,795,497 | 1/1989 | McConnell et al. | 134/18 |
| 4,917,123 | 4/1990 | McConnell et al. | 134/95.2 |
| 5,278,448 | 1/1994 | Fujii | 257/750 |
| 5,308,400 | 5/1994 | Chen | 134/2 |
| 5,328,867 | 7/1994 | Chien et al. | 438/906 |

*Primary Examiner*—Benjamin L. Utech
*Assistant Examiner*—Lynette T. Umez-Eronini
*Attorney, Agent, or Firm*—Wade James Brady, III; Frederick J. Telecky, Jr.

[57] ABSTRACT

A method for semiconductor wafer etching clean-up comprising the steps of placing an oxide layer on a silicon wafer, cleaning the wafer surface with an etching agent cleaning solution, such as hydrofluoric acid, and washing the wafer surface with a cleaning solution, prior to an isopropanol vapor dry in order to reduce the number of defects caused by the formation of watermarks on the wafer surface.

13 Claims, 2 Drawing Sheets

METHOD FOR IMPROVING THE WET PROCESS CHEMICAL SEQUENCE

This application claims priority under 35 USC § 119(e)(1) of provisional application Ser. No. 60/034,214 filed Jan. 9, 1997.

TECHNICAL FIELD OF THE INVENTION

This invention relates, in general, to the reduction of defect density to improve probe yield caused by watermark formation during the wet process chemical sequence, and in particular, to optimizing the clean-up sequence when silicon/silicon dioxide interfaces are exposed during the manufacture of integrated circuits.

BACKGROUND OF THE INVENTION

Without limiting the scope of the invention, its background is described in connection with the processing of semiconductor silicon wafers, as an example.

Heretofore, in this field, defects on integrated circuit wafers have been created during the formation of oxidation layers at junctions were hydrophobic and hydrophilic areas are required to coexist. On layered integrated circuit wafers, these junctions correspond to the layering of adjacent silicon and silicon dioxide ($SiO_2$) layers. For example, it is known that watermarks, also known as waterspots or liquid residue defects, form as a result of certain operations in a manufacturing process flow, for example, that of oxidation. Unfortunately, watermarks are not visible under a microscope until the oxidation process has been completed. The formation of watermarks leads to irregularities in the wafer causing wafer, failures and consequently decreased yield.

As a result of these irregularities, deposition of subsequent layers of material can easily result in incomplete coverage, breaks in the deposited material, or voids if the subsequent layer be deposited directly over the irregular surfaces. If the irregularities are not alleviated at each major processing step, the top surface topography of the surface irregularities will tend to become even more irregular, causing further problems as the layers stack up in the further processing of the semiconductor device.

Depending upon the type of material used and the intended purpose, numerous undesirable characteristics are produced when these irregular layers are deposited. Incomplete coverage of an insulating oxide layer can lead to short circuits between metalization layers. Likewise, voids can trap air or processing gases, either contaminating further processing steps, or simply lowering overall device reliability. Sharp points on conductors can result in unusual, undesirable field effects. One problem that is widely recognized in the wafer manufacturing process is that, in general, processing high density circuits over highly irregular structures can lead to very poor yields and device performance.

As mentioned above, watermarks form at certain logpoints in the process flow, and are not visible under a microscope until after an oxidation step has been completed. Watermarks tend to appear in varying sizes and shapes, and lead to a decrease in device yields by blocking a subsequent etching step, by blocking or altering an implant, or by changing the rate of oxidation growth. Finally, watermarks are a source of impurities that lead to irregularities on the wafer surface.

It is known that watermark formation and defects are caused by hydrofluoric acid used in the clean-up step prior to oxidation. Generally, the hydrofluoric acid (HF) clean-up step leads to watermark formation when the HF step is directly followed by an isopropanol vapor drying step in an IPA dryer. It should be noted by one skilled in the art that when reference is made to HF, the HF solution is diluted with deionized water.

Although the mechanism for watermark formation is not fully understood, it is possible that a residual fluorosililic acid residue or a $H_2SiO_3$ residue is responsible. Previous methods for eliminating watermark formation have focused on spin drying of the wafers or modifying IPA dryer machine parameters. The centrifugal or spin drying process can greatly reduce watermarks, but adds large numbers of particles to the wafer surface, thereby trading one problem for another. Furthermore, it is unreasonable to expect that a wafer fab will replace a working IPA dryer with a spin dryer to reduce watermarks because of the time, money and labor involved. Similarly, modifying IPA dryer parameters such as transfer time from rinse to dryer, IPA change-out frequency and IPA dry time have been moderately successful at reducing watermark formation but have not eliminated watermark formation.

Alternatively, an intermediate hydrogen peroxide cleaning step has been used following the hydrofluoric acid step prior to the isopropanol vapor dry. Although this additional step reduced watermark formation, watermarks have still been detected on the last part of the wafer which enters the vapor dryer.

Conventionally, the last chemical step prior to the isopropanol vapor dry step is the most critical for eliminating watermarks. Watermark formation has been reduced when a chemical oxide was grown following the hydrofluoric acid clean-up, prior to vapor drying. By performing the hydrofluoric acid clean-up step just prior to vapor drying, a minimal thickness of native oxide is formed on the silicon wafer surface of about 2 angstroms. On the other hand, when a chemical oxide layer is formed by following the two typical cleaning steps, between the hydrofluoric acid and vapor drying steps, the oxide thickness is greater, between 5 and 10 angstroms.

What is needed, therefore, is a method that allows for the formation of oxidation layers having the optimal 5 to 10 angstrom thickness, but without the watermarks formed by current methods. Also needed is a method for cleaning up silicon/silicon oxide layers that decreases the amount of acidic and basic chemicals thereby increasing the efficiency of the wafer manufacturing. A decrease in the usage of these potentially hazardous chemicals, and a concomitant increase in overall processing cleanliness and wafer yield, would increase yield per wafer and reduce the amount of chemicals created during the formation of integrated circuit layers. A decrease in the use of these chemicals results in both a cost savings from the decreased use of chemicals used in the clean-up process, as well as a reduced environmental impact from the discarded volumes of chemicals.

SUMMARY OF THE INVENTION

The present invention disclosed herein comprises a method for reducing the formation of defects on silicon wafer surfaces after an HF clean-up step. More particularly, the present invention allows optimization of the clean-up of silicon/silicon oxide interfaces during the manufacturing of integrated circuits. The method disclosed causes a dramatic decrease in the formation of watermark defects on silicon semiconductor wafers. These watermark defects are caused during the wet process chemical sequence. Watermark defects lead to irregularities on the oxide surface, which decrease probe yield. The method of the present invention greatly reduces the formation of watermark defects during a semiconductor wafer etching cycle, and comprises, cleaning the etching agent with an acid based etching solution cleaner, washing the wafer surface with a standard cleaning solution, and finally drying the wafer surface by isopropanol vapor dry. By washing an oxide layer with either an SC1 solution (a mixture of deionized water, ammonium hydroxide and hydrogen peroxide) or an SC2 solution (a mixture of deionized water, hydrochloric acid and hydrogen peroxide) following an HF etching step, the method of the present invention eliminates watermark formation. Using the method of the present invention an increase in overall probe yield, and specifically in the yield from areas most commonly affected by watermark formation, was achieved. Furthermore, using the method of the present invention a standardization of the etching clean-up cycle is achieved that reduced the number of overall steps, and that is applicable to a wide range of semiconductor products. For example, the method has eliminated watermark formation with minimum feature size of 0.5 microns.

The method of the present invention decreases the number of cleaning steps, and consequently, the overall cycle time. The disclosed method also decreases the number of solutions needed for the cleaning cycle, leading to greatly reduced environmental impact from acid and peroxide based solutions. This decrease in usage saves in the energy and effort required to dispose of hazardous chemicals associated with wafer manufacturing, and decreases overall operational expense.

These and other features of the invention that will be apparent to those skilled in the art from the following detailed description of the invention, taken together with the accompanying drawings.

DESCRIPTION OF THE DRAWINGS

In the drawings.

Corresponding numerals and symbols in different figures refer to corresponding parts unless otherwise specified.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

A four-step process was used to evaluate the formation of watermarks on silicon wafers and the impact of these watermarks on wafer yield. First, watermarks were quantified on test lots using different clean-up sequences. Second, Vt shifts were checked along with measurements of gate oxide thickness, followed by in-line CV tests. Third, watermark formation was verified and measurements of electrical device parameters were taken to measure the impact on probe yield. Finally, yield impact was evaluated on larger size production lots.

A 24 safer test run was performed to create a control test group using standard production methods. The wafers were visually inspected to quantify watermark defects before and after the clean-up step. Clean-up splits were performed at three distinct steps: pre field oxidation clean-up, pre pad oxide clean-up (dummy gate), and pre gate oxidation clean-up, in order to assess the steps at which each split's watermarks were formed. Short-flow monitors were created to check for possible Vt shifts. Also, oxide thickness was measured to evaluate the effect on critical gate oxide thickness using different steps.

Following verification of the in-line CV data, production wafer splits were performed. A large sample of production lots was compared to determine if the split lot data accurately predicted the improved probe yield due to reductions in the formation of watermarks that lead to density defects.

Figure 1A:
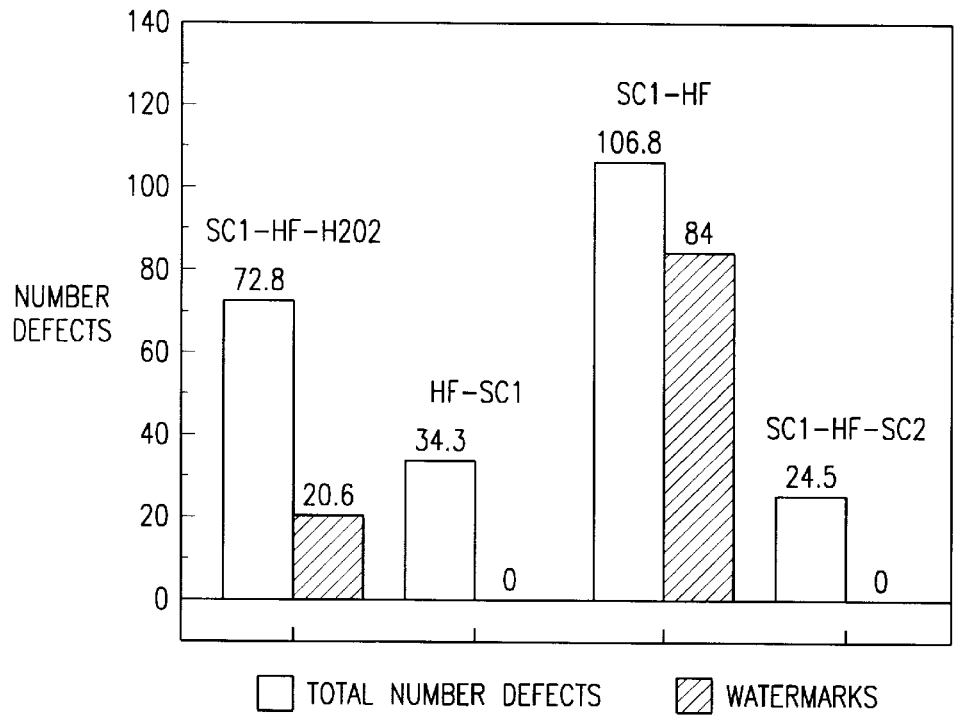
FIG. 1A is a graph with the results obtained by using the present invention after pad oxidation.
Figure 1B:
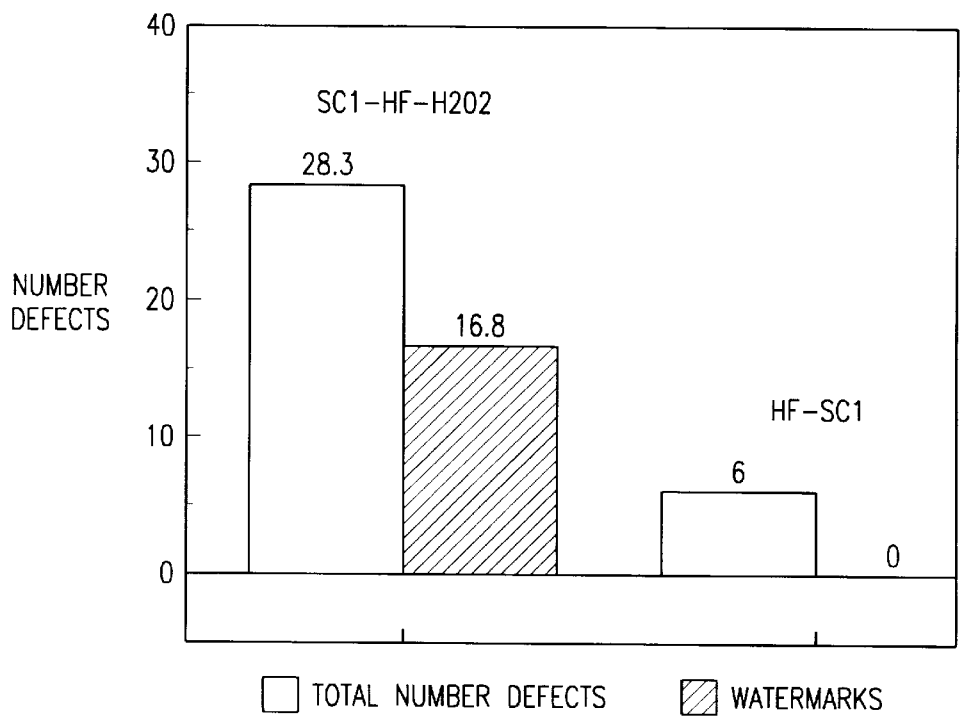
FIG. 1B is a graph with the results obtained by using the present invention after gate oxidation.

The method of the present invention, namely, using the SC1 or SC2 clean-up as the last step before isopropanol vapor dry, lead to the elimination of all watermarks in the test lot evaluated, as shown in FIG. 1A. FIG. 1A shows the number of defects found using the sequence of clean-up steps indicated per column pair, measured after pad oxidation. Each column pair demonstrates the total number of defects on the left, and defects due to watermark formation on the right. FIG. 1B shows similar data for total defects and defects due to watermark formation following the deposition of a gate oxide layer. The combined FIG. 1A and FIG. 1B data demonstrate that the total number of steps for complete clean-up during an etching cycle could be reduced to two: the hydrofluoric acid clean-up step, and an SC1 clean-up step, prior to the isopropanol vapor dry.

Figure 2A:
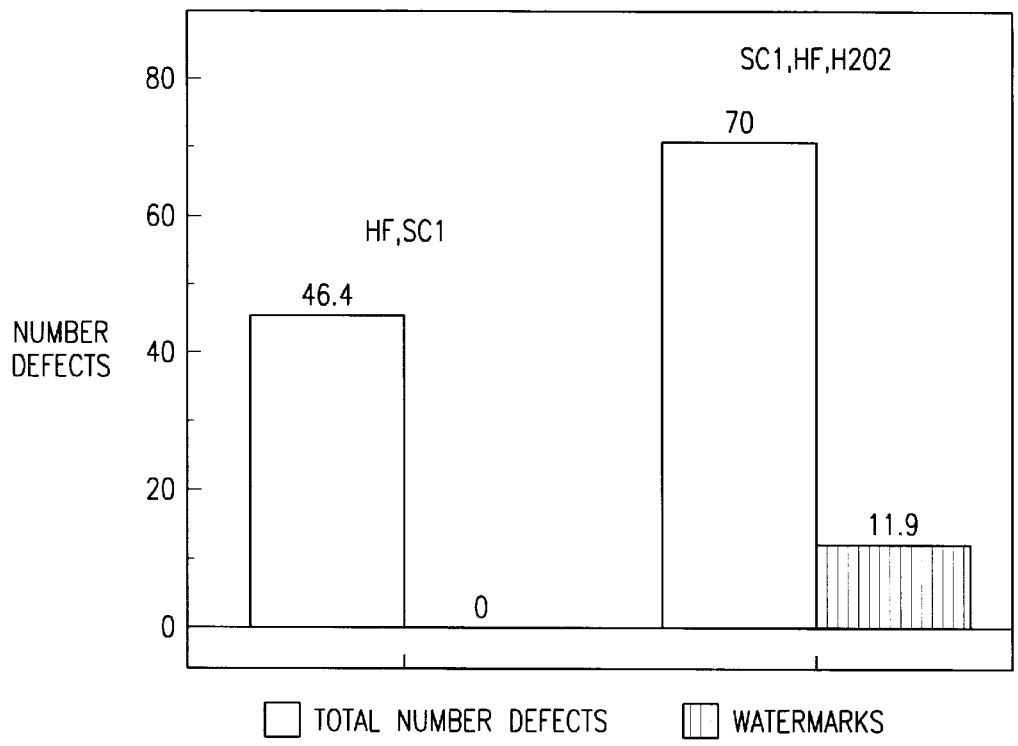
FIG. 2A is a graph with the results obtained by using the present invention after a pad oxidation on a 0.5 micron device.
Figure 2B:
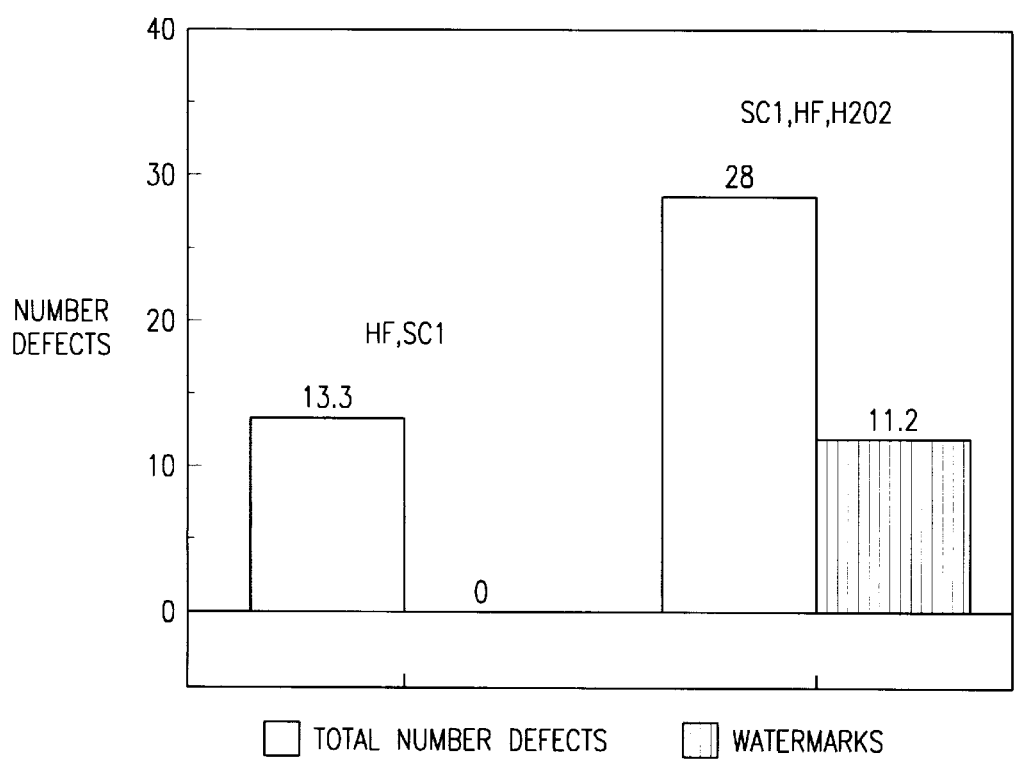
FIG. 2B is a graph with the results obtained by using the present invention after gate oxidation on a 0.5 micron device.

In fact, using either an SC1 and/or SC2 clean-up step prior to vapor dry was found to be just as successful at eliminating watermark formation as depicted in FIGS. 1A and 1B. In a split test that compared the standard clean-up methods used for both 0.5 micron and 0.8 micron linewidth products, the method of the present invention eliminated all watermarks. FIGS. 2A and 2B demonstrate the results obtained at a post pad oxidation step and a post gate oxide deposition step using 0.5 micron production wafers. For the 0.5 micron devices, an average of 11.9 watermarks per wafer were formed using the standard SC1→HF→H202 processing steps. Likewise for 0.8 micron devices, an average of 3.2 watermarks were formed per wafer using the SC1→HF processing sequence. No significant differences were evident when the split test lots were measured for Vt.

The method of the present invention lead to yield improvements in devices having a thickness of 0.5 and a 0.8 microns. Table 1 shows the data obtained with a lot of devices having a 0.5 micron thickness, and Table 2 shows the data obtained using a 0.8 micron thickness. For the 0.5 micron lots, using SC1 as the last cleaning step, or SC1 last process, had no impact on laserprobe yield (LPY) when it is only performed at the pre pad oxidation clean-up step. No difference was found because watermark formation still occurred by using the standard process, namely using the $H_2O_2$ wash last, $H_2O_2$ last, at the pre gate oxidation clean-up.

TABLE 1

| Clean-up | LPY at Flat, % | Total LPY, % |
| --- | --- | --- |
| HF->SC1 | 62.2 | 63.9 |
| SC1->HF->H202 | 52.3 | 61.1 |
| Delta | +9.9 | +2.8 |

TABLE 2

| Clean-up | MPY at Flat, % | Total MPY, % |
| --- | --- | --- |
| HF->SC1 | 50.2 | 48.3 |
| SC1->HF->H202 | 44.8 | 46.8 |
| Delta | +5.4 | +1.5 |

However, when the SC1 last process was performed at two 0.5 micron clean-up operations, an overall yield improvement of 2.8% was observed. In particular, the LPY of the four rows closest to the flat was 9.9% higher. This yield improvement was directly related to reduced watermark formation. For the 0.8 micron split lots, a similar multiprobe yield (MPY) was observed. The overall improvement in the probe yield (1.5%) was not as marked as with the 0.5 micron probe. In the two rows closest to the flat the MPY was 5.4% higher using the SC1 step last.

The SC1 last process of the present invention was tested at logpoints where production wafers are susceptible to watermark formation. The split lots predicted an impact on overall yield, so a much larger sample size was analyzed to better quantify improvements in probe yield. Probe yields were analyzed before and after process changes were made using both 0.5 and 0.8 micron devices.

| Technology | Old Clean-Up Sequences | New Clean-Up Sequences |
| --- | --- | --- |
| 0.5 micron | SC1->HF->$H_2O_2$ | HF->Sc1 |
| 0.8 micron | SC1->HF | HF->Sc1 |

When comparing the old clean-up sequences for the 0.5 micron and 0.8 micron technologies, there was a difference in the process flow. The method of the present invention served, in addition to the reduction in watermark formation, to harmonize the clean-up strategies for both technologies.

The results of using the present invention were measured in three ways: overall yield, yield at the flat, and yield at the top. The data were analyzed, specifically, to isolated the improvement in yield at the flat of the wafer, rather than throughout the wafer. "At the flat" is used to refer to the number of rows of die that are covered, and the formation of watermarks "at the flat" will depend on the die size. In a DMOS4 wafer, this means the first three or four rows of die, but can be as few as one row. "At the top" is defined by the same number of rows on the opposite side of the wafer.

The total impact of the change is defined to be the difference between the overall yield and the overall yield improvement minus the baseline improvement at the top of the wafer. Watermark formation was not found to occur more than two inches from the flat on a six inch wafer. Probe yield data for the two major 0.5 micron devices were compared using the old methods and the method of the present invention. Table III shows an overall yield gain of 12.8% in these test, with a yield gain "at the flat" of 22.4%. These data indicate that the reduced number of watermarks was the major factor in the overall improvement in yield. When comparing the LPY change "at the top" (9.8%), eliminating watermark formation improved overall wafer yield for 0.5 micron devices by 3.0% (12.8%–9.8%). Sample size was 300 wafers using the old method, and 800 wafers using the method of the present invention.

TABLE III

| | Overall Yield (%) | Yield at Top (%) | Yield at Flat (%) |
| --- | --- | --- | --- |
| Old Method | 31.7 | 30.3 | 19.8 |
| New Method | 44.5 | 40.1 | 42.2 |
| Delta | +12.8 | +9.8 | +22.4 |

Likewise, the method of the present invention was used to analyze changes in yield for 0.8 micron devices. The results as shown in Table IV, and reflect a sample size of 1400 wafers per method. Overall yield gain was 7.9%, with a 11.7% increase in yield at the flat. This data indicate that the reduction in watermark formation played a significant part in improving overall yield for 0.8 micron wafers. When compared to the MPY change at the top (7.2%), eliminating watermark formation improved overall wafer yield on 0.8 micron devices by 0.7% (7.9–7,2%).

TABLE IV

| | Overall Yield (%) | Yield at Top (%) | Yield at Flat (%) |
| --- | --- | --- | --- |
| Old Method | 48.0 | 32.3 | 39.2 |
| New Method | 55.9 | 39.5 | 50.9 |
| Delta | +7.9 | +7.2 | +11.7 |

Therefore, the improved method of the present invention serves to greatly reduce the formation of watermarks, reduces the number of steps that are necessary for the etching of $SiO_2$ layers, and helps to harmonize 0.5 and 0.8 micron device clean-up sequences. The reduced number of steps also decreases cycle time.

While this invention has been described with reference to illustrative embodiments, this description is not intended to be construed in a limiting sense. Various modifications and combinations of the illustrative embodiments as well as other embodiments of the invention, will be apparent to those of skill in the are upon reference to the description. It is, therefore, intended that the appended claims encompass any such modifications or embodiments.

What is claimed is:

1. A method for reducing watermark formation on a semiconductor wafer surface during a semiconductor wafer etching clean-up provided after a wet process chemical etching operation in the fabrication of a semiconductor device on said semiconductor wafer, comprising the steps of:

performing said wet process chemical etching operation;
then cleaning the wafer surface with a dilute acid based etching solution;
then washing the wafer surface with a cleaning solution; and
then drying the wafer surface by isopropanol vapor dry.

2. The method as recited in claim 1 wherein the step of cleaning the wafer surface with an acid based etching solution further includes cleaning the wafer surface with hydrofluoric acid.

3. The method as recited in claim 2 wherein the cleaning solution is further defined as comprising deionized water, hydrogen peroxide, and ammonium hydroxide.

4. The method as recited in claim 2 wherein cleaning solution is further defined as comprising deionized water, hydrogen peroxide, and hydrochloric acid.

5. The method as recited in claim 2 wherein cleaning solution is further defined as comprising deionized water and hydrogen peroxide.

6. The method as recited in claim 1 wherein the step of cleaning the wafer surface with an acid based etching solution further includes cleaning the wafer surface with hydrochloric acid.

7. The method as recited in claim 1 wherein the step of cleaning the wafer surface with an acid based etching solution further includes cleaning the wafer surface with sulfuric acid.

8. A method for reducing watermark formation on a semiconductor wafer surface during a semiconductor wafer etching clean-up provided after a wet process chemical etching operation in the fabrication of a semiconductor device on said semiconductor wafer, comprising the steps of:

growing an oxide layer on the wafer surface;

then etching the wafer surface with a dilute acid based etching solution;

then washing the wafer surface with a deionized water based hydrogen peroxide then drying the wafer surface by isopropanol vapor dry.

9. The method as recited in claim 8 wherein the step of etching the wafer surface with an acid based etching solution further includes Etching the wafer surface with hydrofluoric acid.

10. The method as recited in claim 9 wherein the deionized water based hydrogen peroxide cleaning solution is further defined as containing ammonium hydroxide.

11. The method as recited in claim 9 wherein the deionized water based hydrogen peroxide cleaning solution is further defined as containing hydrochloric acid.

12. The method as recited in claim 8 wherein the step of etching the wafer surface with an acid based etching solution further includes etching the wafer surface with hydrochloric acid.

13. The method as recited in claim 8 wherein the step of etching the wafer surface with an acid based etching solution further includes etching the wafer surface with sulfuric acid.

* * * * *